(12) United States Patent
Niwa

(10) Patent No.: US 11,483,507 B2
(45) Date of Patent: Oct. 25, 2022

(54) SOLID-STATE IMAGE PICKUP ELEMENT AND IMAGE PICKUP APPARATUS

(71) Applicant: Sony Semiconductor Solutions Corporation, Kanagawa (JP)

(72) Inventor: Atsumi Niwa, Kanagawa (JP)

(73) Assignee: Sony Semiconductor Solution Corporation, Kanagawa (JP)

( * ) Notice: Subject to any disclaimer, the term of this patent is extended or adjusted under 35 U.S.C. 154(b) by 0 days.

(21) Appl. No.: 16/490,339

(22) PCT Filed: Mar. 13, 2019

(86) PCT No.: PCT/JP2019/010131
§ 371 (c)(1),
(2) Date: Aug. 30, 2019

(87) PCT Pub. No.: WO2019/211949
PCT Pub. Date: Nov. 7, 2019

(65) Prior Publication Data
US 2020/0260032 A1    Aug. 13, 2020

(30) Foreign Application Priority Data
May 2, 2018    (JP) .............................. JP2018-088497

(51) Int. Cl.
*H04N 5/378* (2011.01)
*H04N 5/369* (2011.01)
*H04N 5/3745* (2011.01)
*H01L 27/146* (2006.01)

(52) U.S. Cl.
CPC ........... *H04N 5/378* (2013.01); *H04N 5/3698* (2013.01); *H04N 5/3745* (2013.01); *H01L 27/14643* (2013.01)

(58) Field of Classification Search
CPC .................................................. H04N 5/36963
See application file for complete search history.

(56) References Cited

U.S. PATENT DOCUMENTS

| 10,598,936 | B1 * | 3/2020 | Berkovich | ........... H04N 5/3745 |
| 2002/0008217 | A1 * | 1/2002 | Kakumoto | ........ H01L 27/14623 251/59 |
| 2002/0054389 | A1 * | 5/2002 | Takada | .............. H01L 27/14643 358/513 |

(Continued)

FOREIGN PATENT DOCUMENTS

| JP | 61228667 | 10/1986 |
| JP | 2009508085 A | 2/2009 |

(Continued)

*Primary Examiner* — Twyler L Haskins
*Assistant Examiner* — Dwight Alex C Tejano
(74) *Attorney, Agent, or Firm* — Michael Best & Friedrich LLP

(57) ABSTRACT

There is provided a solid-state image pickup element including: a photodiode configured to convert incident light into a photocurrent; an amplification transistor configured to amplify a voltage between a gate having a potential depending on the photocurrent and a source having a predetermined reference potential and output the amplified voltage from a drain; and a potential supply section configured to supply an anode of the photodiode and a back-gate of the amplification transistor with a predetermined potential lower than the reference potential.

16 Claims, 12 Drawing Sheets

(56) References Cited

U.S. PATENT DOCUMENTS

| | | | |
|---|---|---|---|
| 2004/0130641 A1* | 7/2004 | Mabuchi | H04N 5/3559 |
| | | | 348/302 |
| 2007/0229688 A1* | 10/2007 | Apard | H04N 5/341 |
| | | | 348/302 |
| 2008/0180555 A1* | 7/2008 | Sato | H04N 5/37452 |
| | | | 348/248 |
| 2009/0251576 A1* | 10/2009 | Hattori | H04N 5/335 |
| | | | 348/294 |
| 2010/0079632 A1 | 4/2010 | Walschap et al. | |
| 2014/0240565 A1* | 8/2014 | Murakami | H01L 27/14634 |
| | | | 348/302 |
| 2014/0326854 A1 | 11/2014 | Delbruck et al. | |
| 2015/0160352 A1* | 6/2015 | Tredwell | G01T 1/2018 |
| | | | 378/98.8 |
| 2018/0007306 A1 | 1/2018 | Yanagita et al. | |
| 2018/0098003 A1 | 4/2018 | Matolin et al. | |
| 2018/0146154 A1* | 5/2018 | Sato | H01L 27/14643 |
| 2018/0278877 A1* | 9/2018 | Yamahira | H04N 5/3742 |
| 2018/0350861 A1* | 12/2018 | Kunikiyo | H01L 27/14623 |
| 2019/0096206 A1* | 3/2019 | Nakagawa | H04N 5/374 |

FOREIGN PATENT DOCUMENTS

| | | | | |
|---|---|---|---|---|
| JP | 2009253559 A | 10/2009 | | |
| JP | 2015501936 A | 1/2015 | | |
| JP | 2016-533140 A | 10/2016 | | |
| TW | 201739042 A | 11/2017 | | |
| WO | WO-2017158478 A1 | 9/2017 | | |
| WO | WO-2017179319 A1 * | 10/2017 | | H04N 5/36963 |

\* cited by examiner

[Fig. 1]
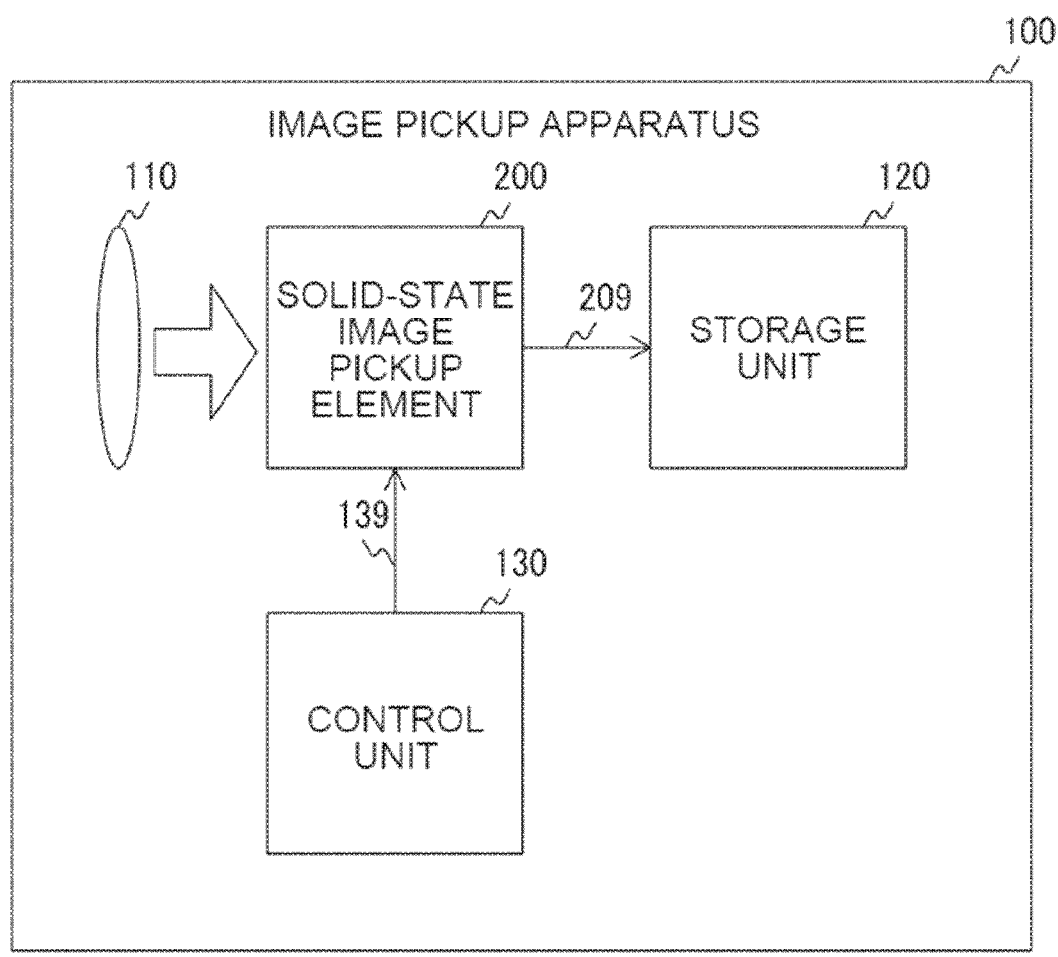

[Fig. 2]
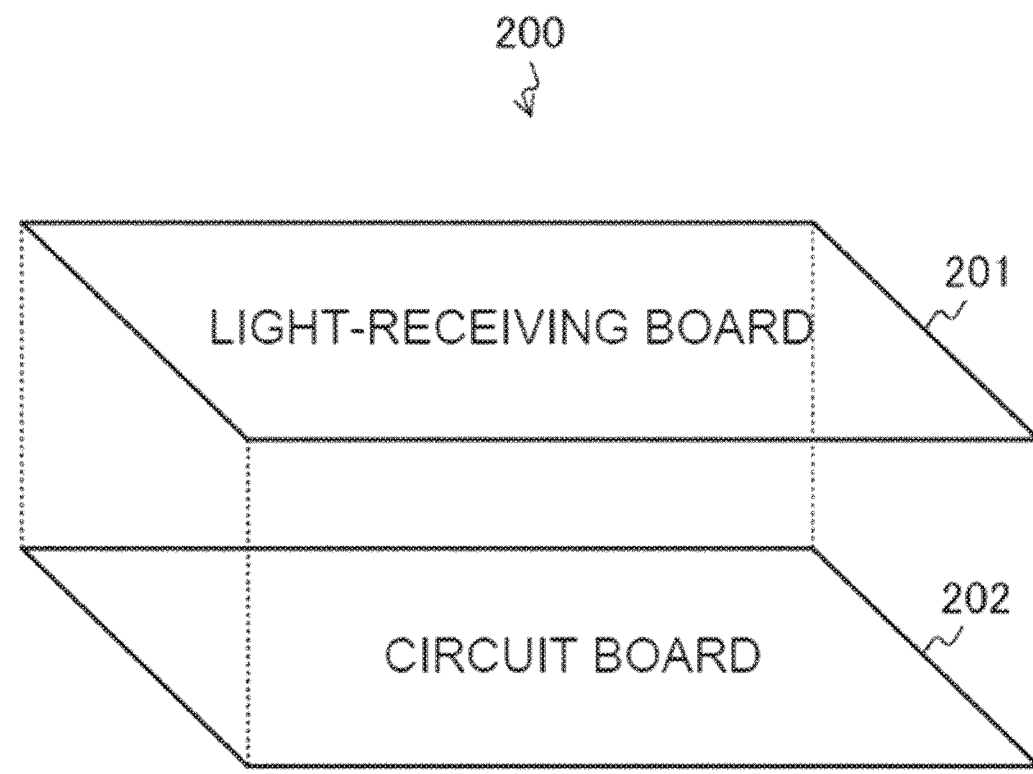

[Fig. 3]
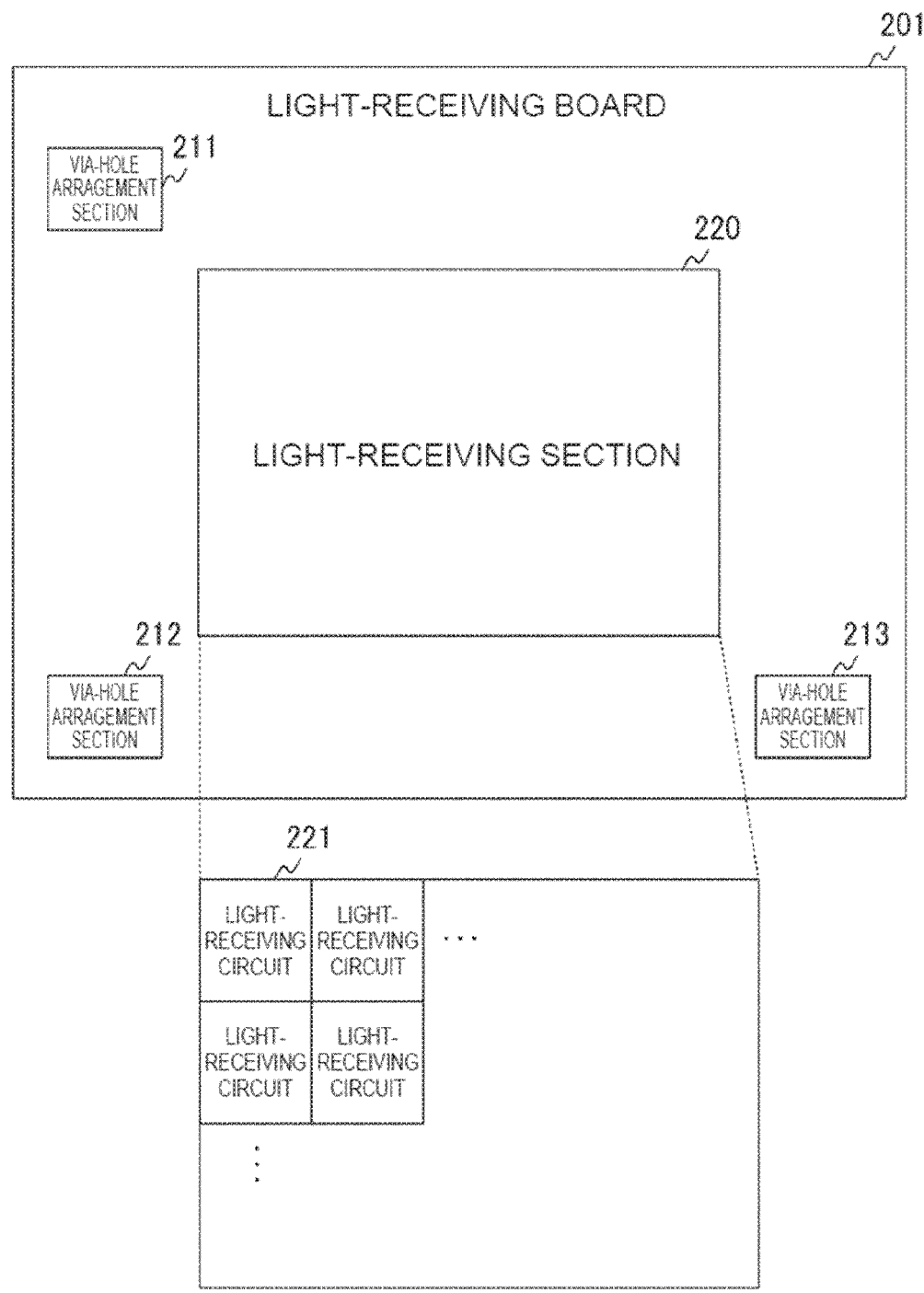

[Fig. 4]
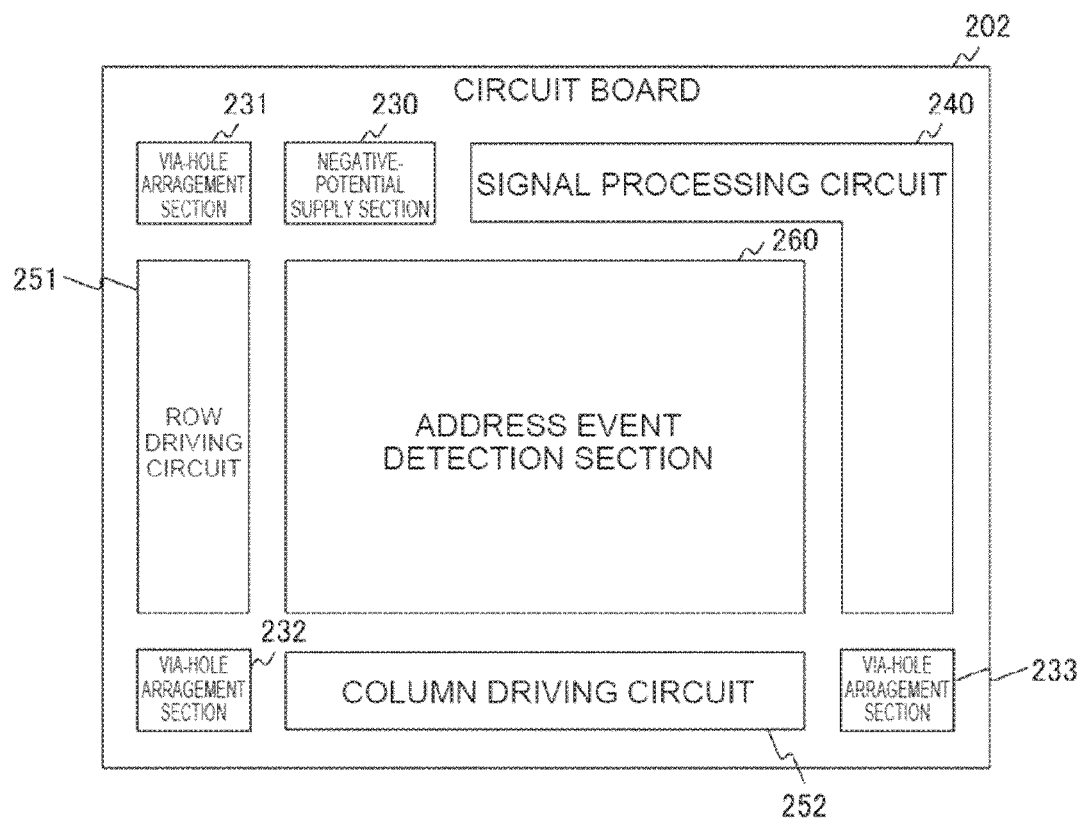

[Fig. 5]
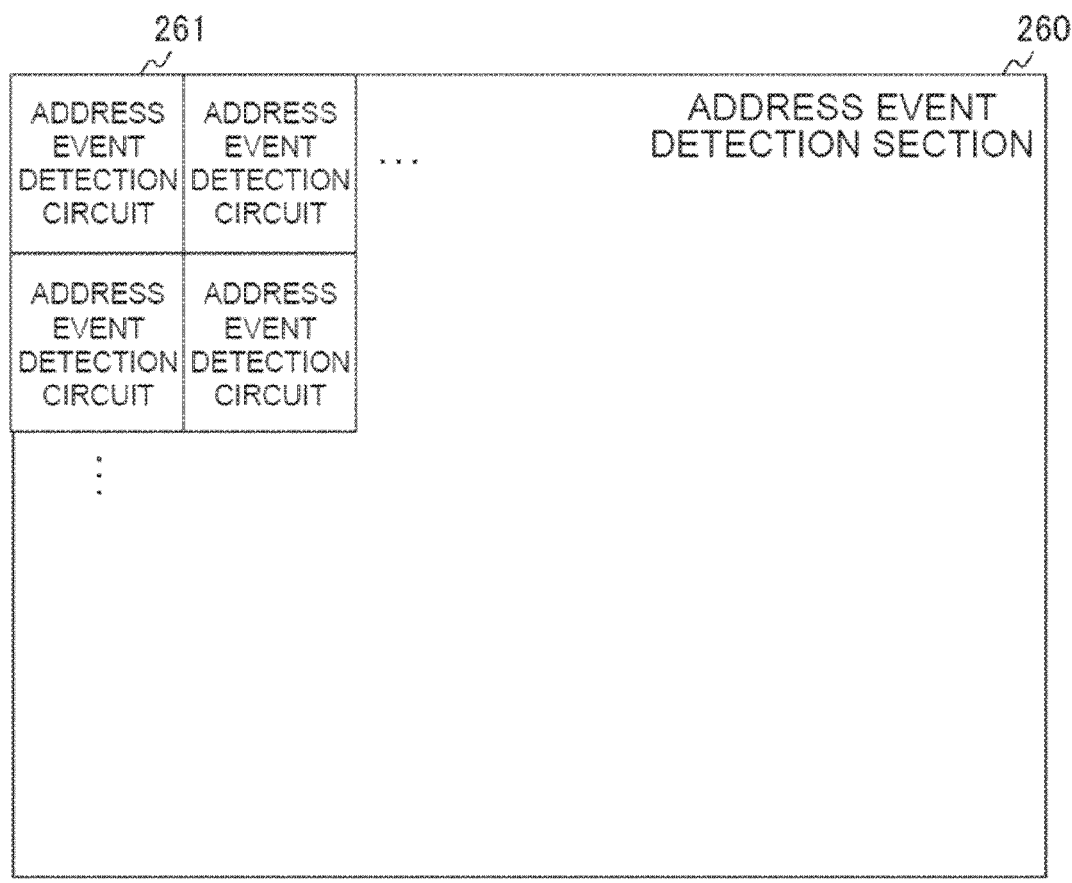

[Fig. 6]
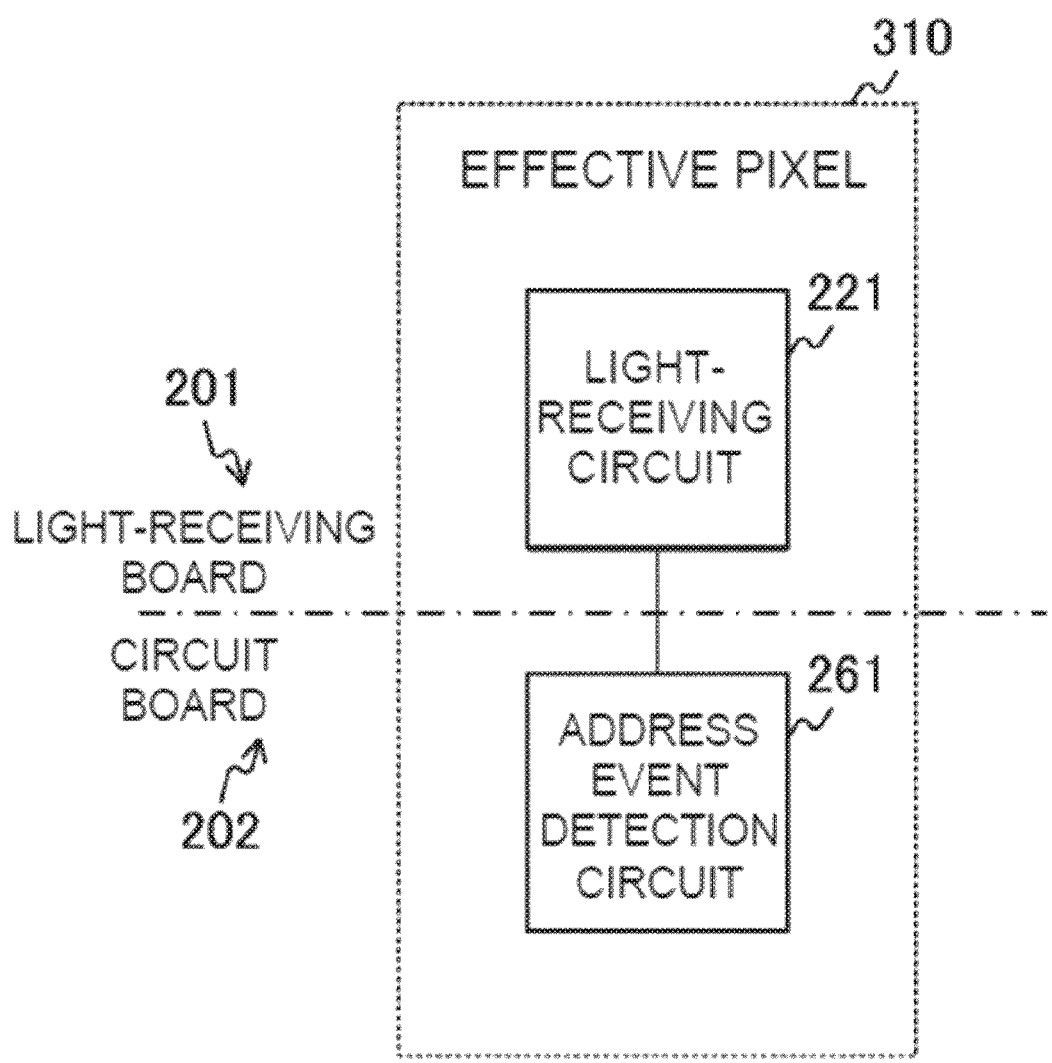

[Fig. 7]
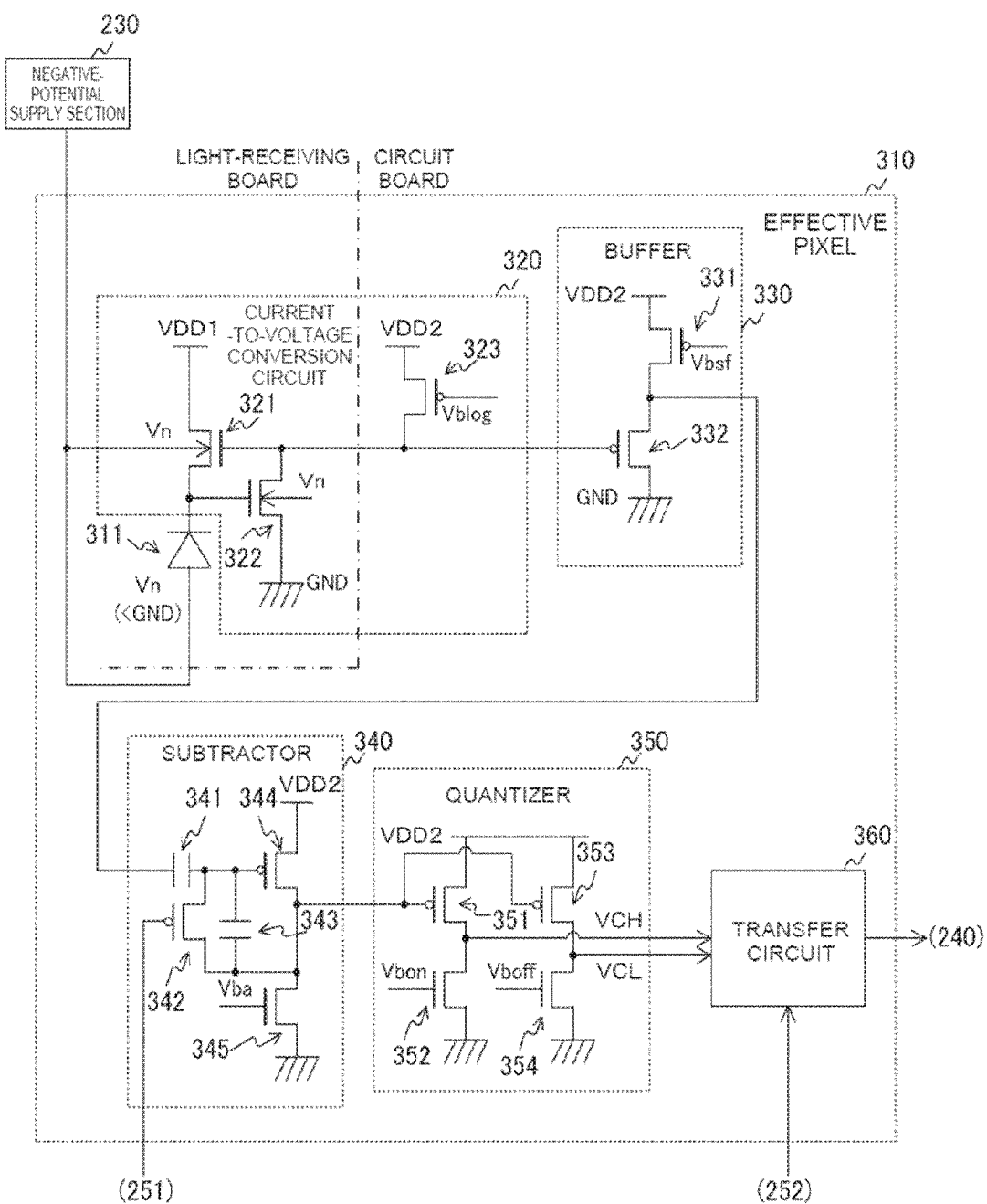

[Fig. 8]
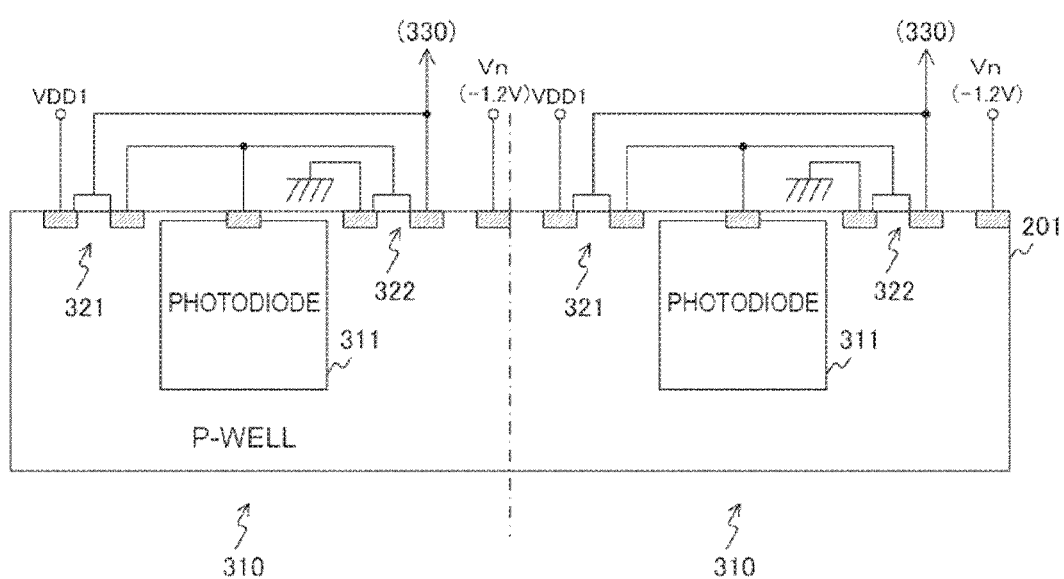

[Fig. 9]
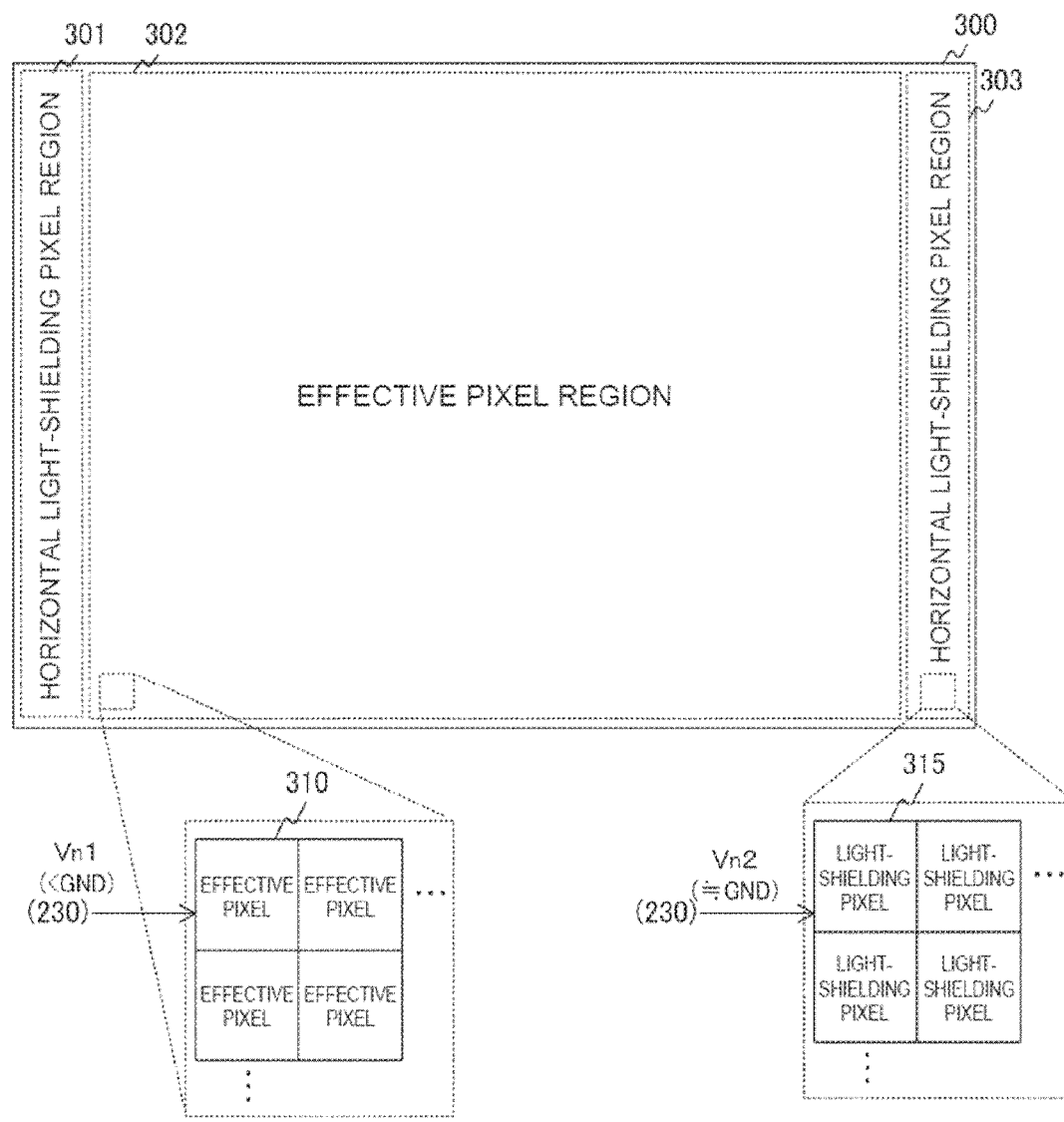

[Fig. 10]
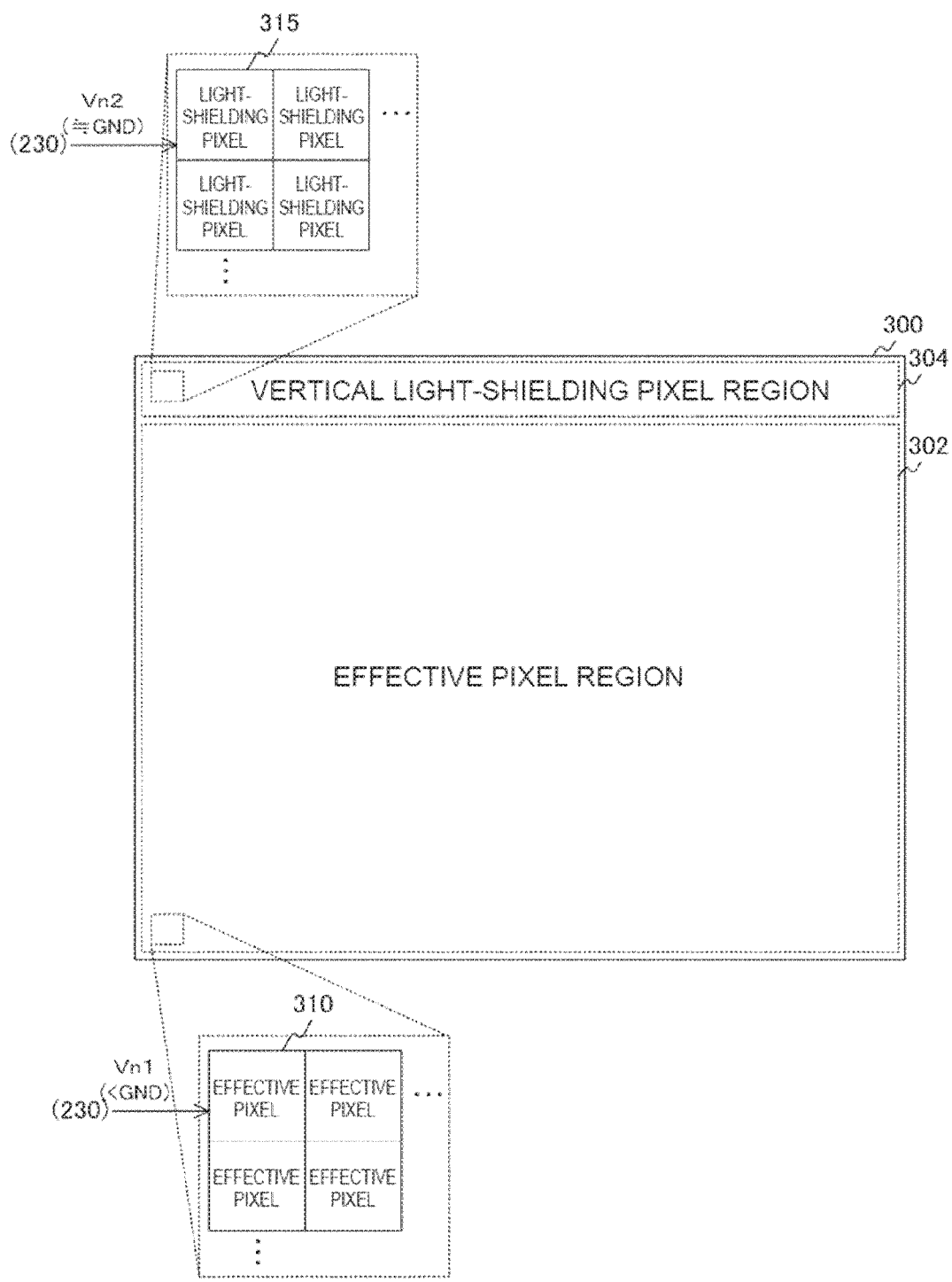

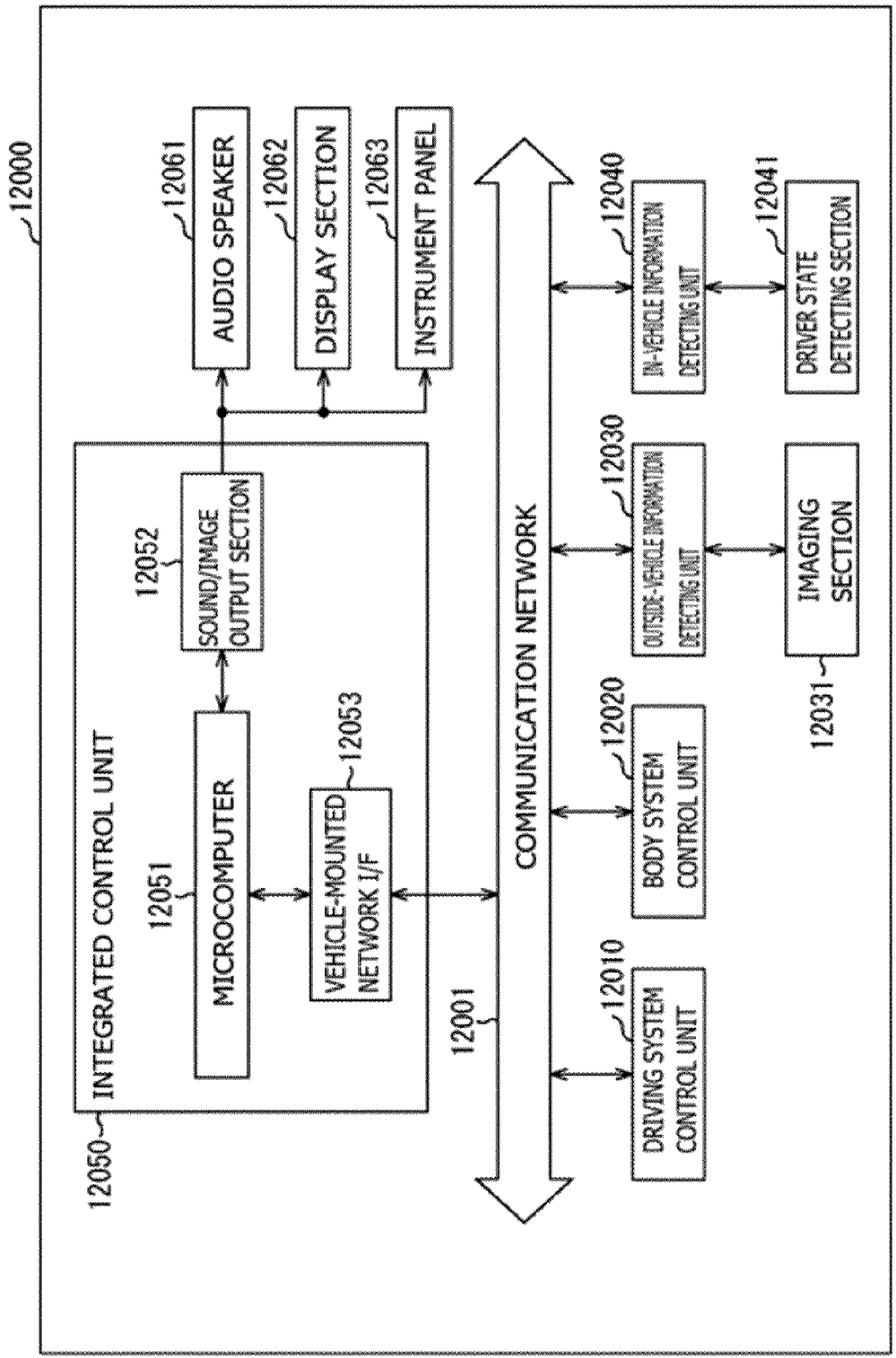

[Fig. 12]
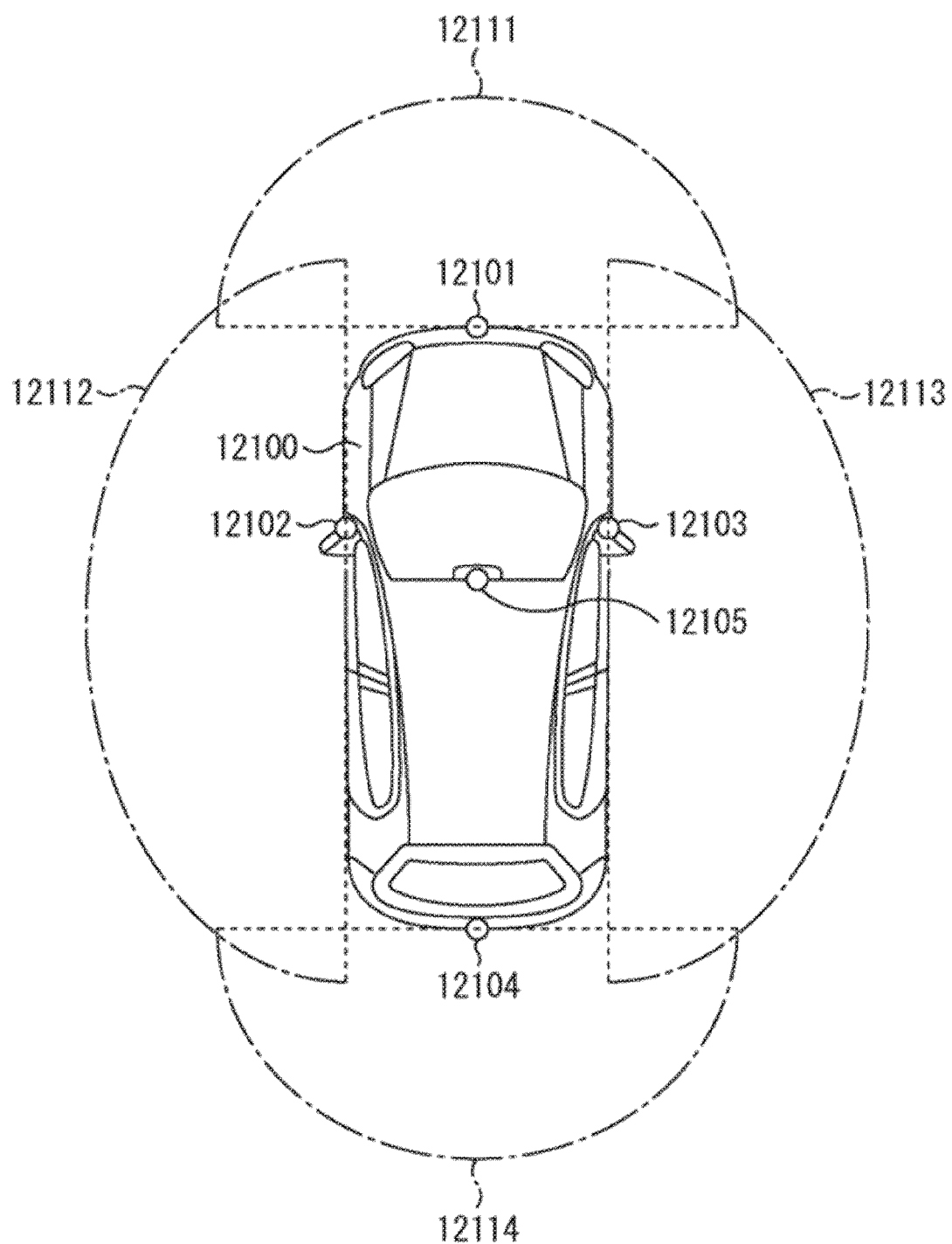

SOLID-STATE IMAGE PICKUP ELEMENT AND IMAGE PICKUP APPARATUS

TECHNICAL FIELD

The present technology relates to a solid-state image pickup element and an image pickup apparatus. Specifically, the present technology relates to a solid-state image pickup element and an image pickup apparatus that detect that the amount of light of a pixel exceeds a threshold.

BACKGROUND ART

From the past, a synchronous solid-state image pickup element that picks up image data (frame) in synchronization with a synchronization signal such as a vertical synchronization signal is used in an image pickup apparatus and the like. With this general synchronous solid-state image pickup element, the image data can be acquired only in each cycle (e.g., 1/60 seconds) of the synchronization signal. Therefore, in a case where it is necessary to achieve processing at higher speed in the fields relating to traffic, robots, and the like, it is difficult to cope with it. In view of this, a non-synchronous solid-state image pickup element has been proposed (e.g., see Patent Literature 1). The non-synchronous solid-state image pickup element includes an address event detection circuit that detects, for each pixel address, that the amount of light of that pixel exceeds the threshold as an address event in real time. The address event detection circuit is provided in each pixel. In this solid-state image pickup element, a photodiode and a plurality of transistors for detecting the address event are arranged for each pixel.

CITATION LIST

Patent Literature

PTL 1: Patent Literature 1: Japanese Unexamined Patent Application Publication No. 2016-533140

SUMMARY

Technical Problem

With such a non-synchronous solid-state image pickup element, data can be generated and output at much higher speed than the synchronous solid-state image pickup element. Therefore, in the traffic field, for example, the safety can be enhanced by executing image recognition processing for a person or an obstacle at high speed. However, when the reverse bias of the photodiode is lowered due to voltage fluctuations such as lowering of a power supply voltage and raising of a ground voltage, the sensitivity of that photodiode may be lowered and the dark current may increase. Therefore, there is a problem that the signal quality is lowered due to the insufficient sensitivity and the dark current. The sensitivity can be enhanced and the dark current can be reduced by increasing the area of the photodiode. However, the number of pixels per unit area decreases in that case, and thus it is undesirable. Further, the sensitivity can be enhanced and the dark current can be reduced also by sufficiently increasing the power supply voltage. However, the power consumption increases in that case, and thus it is unfavorable.

The present technology has been produced in view of such circumstances and it is an object to improve the signal quality of the detection signal in the solid-state image pickup element that detects the address event.

Solution to Problem

In accordance with a first aspect of the present technology, there is provided a solid-state image pickup element including: a photodiode configured to convert incident light into a photocurrent; an amplification transistor configured to amplify a voltage between a gate having a potential depending on the photocurrent and a source having a predetermined reference potential and output the amplified voltage from a drain; and a potential supply section configured to supply an anode of the photodiode and a back-gate of the amplification transistor with a predetermined potential lower than the reference potential. This configuration provides an effect that the reverse bias of the photodiode and the threshold voltage of the amplification transistor are increased.

Further, in this first aspect, the solid-state image pickup element may further include a conversion transistor configured to convert the photocurrent into a voltage between a gate and a source, in which the conversion transistor may include a source which is connected to a cathode of the photodiode and the gate of the amplification transistor, and the drain of the amplification transistor may be connected to the gate of the conversion transistor. This configuration provides an effect that the photocurrent is converted into the voltage.

Further, in this first aspect, the photodiode and the amplification transistor may be arranged in each of an effective pixel in which light is not shielded and a light-shielding pixel in which light is shielded, and the potential supply section may supply the anode of the photodiode corresponding to the effective pixel with the predetermined potential and supply the anode of the photodiode corresponding to the light-shielding pixel with the reference potential. This configuration provides an effect that a negative potential is supplied only to the effective pixel.

Further, in this first aspect, the photodiode, the conversion transistor, and the amplification transistor may be arranged in a predetermined light-receiving board, and the potential supply section may supply the light-receiving board with the negative potential. This configuration provides an effect that the reverse bias of the photodiode and the threshold voltage of the amplification transistor are increased.

Further, in this first aspect, the solid-state image pickup element may further include a buffer configured to output a voltage signal output from the amplification transistor; a subtractor configured to lower a level of the voltage signal from the buffer; and a comparator configured to compare the lowered voltage signal with a predetermined threshold. This configuration provides an effect that an address event is detected.

Further, in this first aspect, the conversion transistor and the amplification transistor may be arranged in a current-to-voltage conversion circuit configured to convert the photocurrent into the voltage signal, and the current-to-voltage conversion circuit may have a power supply voltage different from a power supply voltage of the buffer, the subtractor, and the comparator. This configuration provides an effect that a current-to-voltage conversion is performed with a power supply voltage lower than the power supply voltage of the buffer and the like.

Further, in this first aspect, the buffer, the subtractor, and the comparator may include at least a part which is arranged in a predetermined circuit board stacked on the light-receiving board. This configuration provides an effect that a reverse bias of a photodiode and a threshold voltage of an amplification transistor increase in a solid-state image pickup element having a stacking structure.

Further, in accordance with a second aspect of the present technology, there is provided an image pickup apparatus including: a photodiode configured to convert incident light into a photocurrent; an amplification transistor configured to amplify a voltage between a gate having a potential depending on the photocurrent and a source having a predetermined reference potential and output the amplified voltage from a drain; a potential supply section configured to supply an anode of the photodiode and a back-gate of the amplification transistor with a predetermined potential lower than the reference potential; and a signal processing circuit configured to process a signal output from the amplification transistor. This configuration provides an effect that the signal from the circuit in which the reverse bias of the photodiode and the threshold voltage of the amplification transistor are increased is processed. [Advantageous Effects of Invention]

In accordance with the present technology, an excellent effect that the signal quality of a detection signal can be improved in a solid-state image pickup element that detects an address event can be provided. It should be noted that the effect described here are not necessarily limitative and any effect described in the present disclosure may be provided.

BRIEF DESCRIPTION OF DRAWINGS

FIG. 1 is a block diagram depicting a configuration example of an image pickup apparatus according to an embodiment of the present technology.

FIG. 2 is a diagram for describing a stacking structure of the solid-state image pickup element according to the embodiment of the present technology.

FIG. 3 is an example of a plan view of a light-receiving board according to the embodiment of the present technology.

FIG. 4 is an example of a plan view of a circuit board according to the embodiment of the present technology.

FIG. 5 is a block diagram depicting a configuration example of an address event detection section according to the embodiment of the present technology.

FIG. 6 is a diagram for describing a configuration of an effective pixel according to the embodiment of the present technology.

FIG. 7 is a circuit diagram depicting a configuration example of the effective pixel according to the embodiment of the present technology.

FIG. 8 is an example of a cross-sectional view of effective pixels according to the embodiment of the present technology.

FIG. 9 is an example of a plan view of a pixel array section in a modified example of the embodiment of the present technology.

FIG. 10 is an example of a plan view of a pixel array section obtained by changing the arrangement of the light-shielding pixel region in the modified example of the embodiment of the present technology.

FIG. 11 is a block diagram depicting an example of schematic configuration of a vehicle control system.

FIG. 12 is a diagram of assistance in explaining an example of installation positions of an outside-vehicle information detecting section and an imaging section.

DESCRIPTION OF EMBODIMENTS

Hereinafter, mode for carrying out the present technology (hereinafter, referred to as embodiment) will be described. Descriptions will be given in the following order.

1. Embodiment (Example in which negative potential is supplied to anode of photodiode)
2. Example of Application to Movable Object 1. Embodiment Configuration Example of Image Pickup Apparatus FIG. 1 is a block diagram depicting a configuration example of an image pickup apparatus 100 according to the embodiment of the present technology. This image pickup apparatus 100 includes an image pickup lens 110, a solid-state image pickup element 200, a storage unit 120, and a control unit 130. Examples of provided in can include a camera to be provided in a wearable device, a vehicle-mounted camera, and the like.

The image pickup lens 110 condenses incident light and introduces the condensed incident light into the solid-state image pickup element 200.

The solid-state image pickup element 200 detects that an absolute value of an amount of change of luminance exceeds a threshold for each of a plurality of pixels, as an address event. This address event includes, for example, an on-event indicating that an amount of luminance increase exceeds an upper-limit threshold and an off-event indicating that an amount of luminance decrease becomes lower than a lower-limit threshold lower than the upper-limit threshold. Then, the solid-state image pickup element 200 generates a detection signal indicating the detection result of the address event for each pixel. Each detection signal includes an on-event detection signal VCH indicating the presence/absence of the on-event and an off-event detection signal VCL indicating the presence/absence of the off-event. It should be noted that although the solid-state image pickup element 200 detects the presence/absence of both of the on-event and the off-event, the solid-state image pickup element 200 may detect the presence/absence of only either one of the on-event and the off-event.

The solid-state image pickup element 200 executes predetermined signal processing such as image recognition processing on the image data including the detection signal and outputs the processed data to the storage unit 120 via a signal line 209.

The storage unit 120 stores the data from the solid-state image pickup element 200. The control unit 130 controls the solid-state image pickup element 200 to pick up the image data.

Configuration Example of Solid-State Image Pickup Element

FIG. 2 is a diagram depicting an example of a stacking structure of the solid-state image pickup element 200 according to the embodiment of the present technology. This solid-state image pickup element 200 includes a circuit board 202 and a light-receiving board 201 stacked on the circuit board 202. Those boards are electrically connected to each other via a connection such as a via-hole. It should be noted that those boards may be connected to each other by Cu—Cu bonding or with a bump other than the via-hole.

FIG. 3 is an example of a plan view of the light-receiving board 201 according to the embodiment of the present technology. The light-receiving board 201 includes a light-receiving section 220 and via-hole arrangement sections 211, 212, and 213.

Via-holes to be connected to the circuit board 202 are arranged in the via-hole arrangement sections 211, 212, and 213. Further, in the light-receiving section 220, a plurality of light-receiving circuits 221 are arranged in a matrix form. The light-receiving circuits 221 photoelectrically converts incident light to generate a photocurrent, performs current-to-voltage conversion on that photocurrent, and outputs the resulting voltage signal. A pixel address including a row address and a column address is assigned to each of those light-receiving circuits 221.

FIG. 4 is an example of a plan view of the circuit board 202 according to the embodiment of the present technology. This circuit board 202 includes a negative-potential supply section 230, via-hole arrangement sections 231, 232, and 233, a signal processing circuit 240, a row driving circuit 251, a column driving circuit 252, and an address event detection section 260. Via-holes to be connected to the light-receiving board 201 are arranged in the via-hole arrangement sections 231, 232, and 233.

The negative-potential supply section 230 supplies the light-receiving board 201 with a predetermined potential lower than a predetermined reference potential (e.g., ground potential). The predetermined potential is supplied as a negative potential. For example, a charge pump circuit is used as the negative-potential supply section 230. Effects provided by suppling the negative potential will be described later. It should be noted that the negative-potential supply section 230 is an example of a potential supply section defined in the scope of claims.

The address event detection section 260 generates a detection signal from a voltage signal of each of the plurality of light-receiving circuits 221 and outputs the generated detection signal to the signal processing circuit 240.

The row driving circuit 251 selects a row address and causes the address event detection section 260 to output a detection signal corresponding to that row address.

The column driving circuit 252 selects a column address and causes the address event detection section 260 to output a detection signal corresponding to that column address.

The signal processing circuit 240 executes predetermined signal processing on detection signals from the address event detection section 260. This signal processing circuit 240 arranges detection signals as pixel signals in a matrix form and acquires image data including two-bit information for each pixel. Then, the signal processing circuit 240 executes signal processing such as image recognition processing on that image data.

FIG. 5 is an example of a plan view of the address event detection section 260 according to the embodiment of the present technology. In this address event detection section 260, a plurality of address event detection circuits 261 are arranged in a matrix form. A pixel address is assigned to each of the address event detection circuits 261. Each of the address event detection circuits 261 is connected to each of the light-receiving circuits 221, which has the same address as the corresponding address event detection circuit 261.

The address event detection circuit 261 quantizes a voltage signal from the corresponding light-receiving circuit and outputs the quantized voltage signal as a detection signal.

Configuration Example of Effective Pixel

FIG. 6 is a diagram for describing a configuration of an effective pixel 310 according to the embodiment of the present technology. The effective pixel 310 includes the light-receiving circuit 221 inside the light-receiving board 201 and the address event detection circuit 261 inside the circuit board 202, to which the same pixel address is assigned. As described above, in each of the boards, the plurality of light-receiving circuits 221 and the plurality of address event detection circuits 261 are arranged in a matrix form. Therefore, a plurality of effective pixels 310 each including the light-receiving circuit 221 and the address event detection circuit 261 are arranged in a matrix form in the solid-state image pickup element 200.

FIG. 7 is a circuit diagram depicting a configuration example of the effective pixel 310 according to the embodiment of the present technology. This effective pixel 310 includes a photodiode 311, a current-to-voltage conversion circuit 320, a buffer 330, a subtractor 340, a quantizer 350, and a transfer circuit 360.

The photodiode 311 photoelectrically converts incident light to generate a photocurrent. This photodiode 311 supplies the generated photocurrent to the current-to-voltage conversion circuit 320.

The current-to-voltage conversion circuit 320 converts the photocurrent from the photodiode 311 into a voltage signal corresponding to the photocurrent. This current-to-voltage conversion circuit 320 inputs the voltage signal into the buffer 330.

The buffer 330 outputs the input voltage signal to the subtractor 340. With this buffer 330, driving force for driving a post-stage can be increased. Further, with the buffer 330, isolation of noise due to a switching operation at the post-stage can be ensured.

The subtractor 340 determines an amount of change of a correction signal by subtraction. This subtractor 340 supplies the amount of change to the quantizer 350 as a differential signal.

The quantizer 350 converts (in other words, quantizes) an analog differential signal into a digital detection signal by comparing the differential signal with a predetermined threshold. This quantizer 350 compares the differential signal with each of the upper-limit threshold and the lower-limit threshold and supplies the transfer circuit 360 as the comparison results thereof as two-bit detection signals. It should be noted that the quantizer 350 is an example of a comparator defined in the scope of claims.

The transfer circuit 360 transfers the detection signal to the signal processing circuit 240 in accordance with a column driving signal from the column driving circuit 252.

Further, the current-to-voltage conversion circuit 320 includes N-type transistors 321 and 322 and a P-type transistor 323. A metal-oxide-semiconductor (MOS) transistor is used as those transistors, for example.

A source of the N-type transistor 321 is connected to a cathode of the photodiode 311 and a drain of the N-type transistor 321 is connected to a terminal having a power supply voltage VDD1. The P-type transistor 323 and the N-type transistor 322 are connected in series between a terminal having a power supply voltage VDD2 and a terminal having a reference potential (e.g., ground potential GND). Further, a connection point between the P-type transistor 323 and the N-type transistor 322 is connected to a gate of the N-type transistor 321 and an input terminal of the buffer 330. Further, a predetermined bias voltage Vblog is applied on a gate of the P-type transistor 323.

The drain of the N-type transistor 321 and a drain of the N-type transistor 322 are connected to a side of a power supply and such a circuit is called source follower. The N-type transistor 321 of those transistors converts a photocurrent into a voltage between the gate and the source. The N-type transistor 322 amplifies a voltage between a gate having a potential depending on the photocurrent and a source having the reference potential (e.g., ground potential GND) and outputs the amplified voltage from the drain.

Further, the P-type transistor 323 supplies a constant current to the N-type transistor 322. With such a configuration, the photocurrent from the photodiode 311 is converted into the voltage signal.

It should be noted that the N-type transistor 321 is an example of a conversion transistor defined in the scope of claims and the N-type transistor 322 is an example of an amplification transistor defined in the scope of claims.

Further, the photodiode 311 and the N-type transistors 321 and 322 are arranged in the light-receiving board 201 and the circuits following the P-type transistor 323 are arranged in the circuit board 202.

Then, the negative-potential supply section 230 supplies a negative potential Vn lower than the reference potential (e.g., ground potential GND) to a P-well region of the light-receiving board 201. The photodiode 311 is embedded in this P-well region. Further, back-gates (bulks) of the N-type transistors 321 and 322 are formed in that region. Therefore, by supplying the negative potential Vn to the P-well region, the negative potential Vn can be supplied to an anode of the photodiode 311 and the respective back-gates of the N-type transistors 321 and 322.

By setting the anode of the photodiode 311 to have the negative potential Vn, the reverse bias of the photodiode 311 is larger as compared to a case where that potential is set to the reference potential. With this setting, the sensitivity of the photodiode 311 is increased and the dark current can be reduced. Further, by setting the back-gates of the N-type transistors 321 and 322 to have the negative potential Vn, a threshold voltage of each transistor is higher due to a board bias effect as compared to the case where those potentials are set to the reference potential. With this setting, it is possible to prevent the voltages between the gates to the sources of those transistors from being equal to or lower than zero. When the voltages between the gates to the sources are equal to or lower than zero, it may be impossible to obtain a normal output because of the circuit configuration of the current-to-voltage conversion circuit 320. Therefore, such a situation can be suppressed by supplying the negative potential Vn. In this manner, the signal quality of the detection signal can be improved due to the increased sensitivity of the photodiode 311, the reduced dark current, and the higher threshold voltage.

The N-type transistors included in the circuits at the post-stage following the buffer 330 can also be arranged in the P-well region having the negative potential Vn. Even if such a configuration is employed, it is difficult to obtain the effect in view of the characteristics, which have been described in the context of the current-to-voltage conversion operation. Further, it is typically desirable that the current-to-voltage conversion circuit 320 be isolated while the circuits at the post-stage are operated having a large amplitude or a high logic level. It is thus basically favorable to provide a configuration in which the P-well region on the light-receiving side is separated from the circuits at the post-stage.

Further, the buffer 330 includes P-type transistors 331 and 332. MOS transistors are used as those transistors, for example.

The P-type transistors 331 and 332 are connected in series between a terminal having the power supply voltage VDD2 and a terminal having the reference potential (e.g., GND). Further, a predetermined bias voltage Vbsf is applied on a gate of the P-type transistor 331. A gate of the P-type transistor 332 is connected to an output terminal of the current-to-voltage conversion circuit 320. Then, the voltage signal is output to the subtractor 340 from a connection point between the P-type transistors 331 and 332.

The subtractor 340 includes capacitors 341 and 343, P-type transistors 342 and 344, and an N-type transistor 345.

The P-type transistor 344 and the N-type transistor 345 are connected in series between a terminal having the power supply voltage VDD2 and a terminal having the reference potential. By setting a gate of the P-type transistor 344 as an input terminal and a connection point between the P-type transistor 344 and the N-type transistor 345 as an output terminal, the P-type transistor 344 and the N-type transistor 345 function as an inverter that inverts an input signal.

One end of the capacitor 341 is connected to an output terminal of the buffer 330 and the other end of the capacitor 341 is connected to an input terminal of the inverter (i.e., the gate of the P-type transistor 344). The capacitor 343 connected in parallel to the inverter. The P-type transistor 342 opens/closes a path for connecting both ends of the capacitor 343 to each other in accordance with a row driving signal.

When the P-type transistor 342 is turned on, a voltage signal $V_{init}$ is input on a side of the capacitor 341, which is closer to the buffer 330, and an opposite side thereof is a virtual ground terminal. For the sake of convenience, the potential of this virtual ground terminal is set to zero. At this time, assuming that the capacitance of the capacitor 341 is C1, a potential $Q_{init}$ accumulated in the capacitor 341 is expressed as an expression below. On the other hand, both ends of the capacitor 343 are short-circuited, and thus the accumulated electric charge is zero.

$$Q_{init}=C1*V_{init} \qquad \text{Expression 1}$$

Next, assuming a case where the P-type transistor 342 is turned off and a voltage on the side of the capacitor 341, which is closer to the buffer 330, changes and becomes $V_{after}$, electric charge $Q_{after}$ accumulated in the capacitor 341 is expressed as an expression below.

$$Q_{after}=C1*V_{after} \qquad \text{Expression 2}$$

On the other hand, assuming that an output voltage is $V_{out}$, electric charge Q2 accumulated in the capacitor 343 is expressed as an expression below.

$$Q2=-C2*V_{out} \qquad \text{Expression 3}$$

At this time, a total electric charge amount of the capacitors 341 and 343 does not change, and thus an expression below is established.

$$Q_{init}=Q_{after}+Q2 \qquad \text{Expression 4}$$

When Expression 4 is modified by substituting Expressions 1 to 3 into Expression 4, an expression below is obtained.

$$V_{out}=-(C1/C2)*(V_{after}-V_{init}) \qquad \text{Expression 5}$$

Expression 5 expresses a subtraction operation of the voltage signal and the gain which is a subtraction result is C1/C2. It is typically desirable to maximize the gain. Therefore, it is favorable to set C1 to be large and C2 to be small. However, when C2 is too small, kTC noise increases and a noise characteristic may be deteriorated. Therefore, reduction of the capacitance of C2 is limited to such a range that noise can be allowed. Further, the subtractor 340 is provided in each effective pixel 310. Therefore, the area for the capacitance C1 and C2 is limited. In view of those circumstances, for example, C1 is set to a value of 20 to 200 femtofarads (fF) and C2 is set to a value of 1 to 20 femtofarads (fF).

The quantizer 350 includes P-type transistors 351 and 353 and N-type transistors 352 and 354. MOS transistors are used as those transistors, for example.

The P-type transistor 351 and the N-type transistor 352 are connected in series between a terminal having the power supply voltage VDD2 and a terminal having the reference potential. The P-type transistor 353 and the N-type transistor 354 are also connected in series between a terminal having the power supply voltage VDD2 and a terminal having the reference potential. Further, gates of the P-type transistors 351 and 353 are connected to an output terminal of the subtractor 340. A bias voltage Vbon indicating an upper-limit threshold is applied on a gate of the N-type transistor 352. A bias voltage Vboff indicating a lower-limit threshold is applied on a gate of the N-type transistor 354.

A connection point between the P-type transistor 351 and the N-type transistor 352 is connected to the transfer circuit 360 and a voltage of this connection point is output as the on-event detection signal VCH. A connection point between the P-type transistor 353 and the N-type transistor 354 is also connected to the transfer circuit 360 and a voltage of this connection point is output as the off-event detection signal VCL. With such connection, the quantizer 350 outputs the on-event detection signal VCH at a high level if the differential signal exceeds the upper-limit threshold and outputs the off-event detection signal VCL at a low level if the differential signal becomes lower than the lower-limit threshold.

It should be noted that although the photodiode 311 and a part of the current-to-voltage conversion circuit 320 are arranged in the light-receiving board 201 and the circuits at the post-stage thereof are arranged in the circuit board 202, the circuits arranged in the respective chips are not limited to this configuration. For example, the photodiode 311 and the entire current-to-voltage conversion circuit 320 may be arranged in the light-receiving board 201 and other circuits may be arranged in the circuit board 202. Further, the photodiode 311, the current-to-voltage conversion circuit 320, and the buffer 330 may be arranged in the light-receiving board 201 and other circuits may be arranged in the circuit board 202. Further, the photodiode 311, the current-to-voltage conversion circuit 320, the buffer 330, and the capacitor 341 may be arranged in the light-receiving board 201 and other circuits may be arranged in the circuit board 202. Further, the photodiode 311, the current-to-voltage conversion circuit 320, the buffer 330, the subtractor 340, and the quantizer 350 may be arranged in the light-receiving board 201 and other circuits may be arranged in the circuit board 202.

FIG. 8 is an example of a cross-sectional view of the effective pixels 310 according to the embodiment of the present technology. In each P-well region of the light-receiving board 201, the photodiode 311 is embedded and the back-gates of the N-type transistors 321 and 322 are formed. The drain of the N-type transistor 321 is supplied with the power supply voltage VDD1 and the potential of the source of the N-type transistor 322 is the reference potential (e.g., GND). Further, P-well regions of the adjacent effective pixels 310 are separated from each other at the long dashed short dashed line.

By supplying the back-gate (bulk) of the N-type transistor 321 with the negative potential Vn, a high voltage is applied between the drain and the back-gate as compared to a case where the reference potential is applied. Typically, regarding the output of the current-to-voltage conversion circuit 320, it is desirable to achieve a large-amplitude operation for extending the dynamic range, and it is difficult to lower the power supply voltage VDD2 at the post-stage. However, regarding the power supply voltage VDD1, the dynamic range is not greatly affected. Therefore, it is desirable to set the power supply voltage VDD1 to be lower than the power supply voltage VDD2.

The photocurrent from all the effective pixels 310 flows into the negative-potential supply section 230. If IR drop causes a potential gradient in the pixel plane, the pixel characteristics themselves may also be varied in the plane in a manner that depends on the IR-drop. Therefore, it is favorable to eliminate the negative potential gradient in the pixel plane by arranging via-holes at a plurality of positions of the light-receiving board 201 and the circuit board 202.

As described above, in accordance with the embodiment of the present technology, the reverse bias of the photodiode 311 and the threshold voltage can be increased by supplying the negative potential Vn to the anode of the photodiode 311 and the back-gate of the N-type transistor 321 or the like. With the increased reverse bias, the sensitivity of the photodiode 311 can be enhanced and the dark current can be reduced. Further, with the increased threshold voltage, a situation in which it may be impossible to obtain a normal output can be suppressed. Therefore, the signal quality of the detection signal can be improved.

Modified Example

In the above-mentioned embodiment, the negative-potential supply section 230 supplies the negative potential Vn to all the pixels. However, the power consumption may increase as the number of pixels increases. A solid-state image pickup element 200 according to this modified example is different from the above-mentioned embodiment in that the light-shielding pixel is not supplied with the negative potential Vn.

FIG. 9 is an example of a plan view of a pixel array section 300 in the modified example of the embodiment of the present technology. This pixel array section 300 includes a light-receiving section 220 and an address event detection section 260 which are stacked on each other. The pixel array section 300 includes horizontal light-shielding pixel regions 301 and 303 and an effective pixel region 302.

The plurality of effective pixels 310 are arranged in a matrix form in the effective pixel region 302. Light is not shielded in those pixels.

On the other hand, a plurality of light-shielding pixels 315 are arranged in a matrix form each of the horizontal light-shielding pixel regions 301 and 303. Light is shielded in those pixels. Further, column addresses different from those of effective pixels 310 are assigned to light-shielding pixels 315 within the horizontal light-shielding pixel regions 301 and 303. Further, a circuit configuration of the light-shielding pixels 315 is similar to the effective pixels 310.

The negative-potential supply section 230 supplies a negative potential Vn1 to the P-well region of the effective pixel 310. On the other hand, the negative-potential supply section 230 supplies a potential Vn2 such as the reference potential (GND) to P-well regions of the light-shielding pixels 315.

The signal processing circuit 240 and the circuits at the post-stage thereof determine a dark current amount on the basis of pixel signals from the light-shielding pixels 315 and remove the dark current in pixel signals from the effective pixels 310.

It should be noted that although the horizontal light-shielding pixel regions 301 and 303 are arranged, a vertical light-shielding pixel region 304 may be arranged instead of the horizontal light-shielding pixel regions 301 and 303, as illustrated in FIG. 10. Row addresses different from those of the effective pixels 310 are assigned to the light-shielding pixels 315 within this vertical light-shielding pixel region 304. Further, both of the horizontal light-shielding pixel regions 301 and 303 and the vertical light-shielding pixel region 304 may be arranged.

As described above, in accordance with the modified example of the embodiment of the present technology, the negative-potential supply section 230 supplies the negative potential Vn1 only to the effective pixels 310 of all the pixels. The power consumption can thus be reduced as compared to the case where the negative potential Vn1 is supplied to all the pixels.

Example of Application to Movable Object

The technology (present technology) according to the present disclosure can be applied to various products. For example, the technology according to the present disclosure may be realized as a device mounted on any kind of movable objects such as a car, an electric car, a hybrid electric car, a motorcycle, a bicycle, a personal mobility, an aircraft, a drone, a ship, and a robot.

FIG. 11 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 11, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 11, an audio speaker 12061, a display section 12062, and an instrument panel 12063 are illustrated as the output device. The display section 12062 may, for example, include at least one of an on-board display and a head-up display.

FIG. 12 is a diagram depicting an example of the installation position of the imaging section 12031.

In FIG. 12, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 12 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Hereinabove, the example of the vehicle control system to which the technology according to the present disclosure can be applied has been described. The technology according to the present disclosure can be applied to the imaging section 12031 of the above-mentioned configurations. Specifically, the image pickup apparatus 100 of FIG. 1 can be applied to the imaging section 12031. By applying the technology according to the present disclosure to the imaging section 12031, the signal quality of the detection signal can be improved. Therefore, the accuracy of image recognition or the like using a detection signal can be improved.

Note that the above-mentioned embodiments provide examples for embodying the present technology and the matters in the embodiments and the invention-specifying matters in the scope of claims are associated. Similarly, the invention-specifying matters in the scope of claims and the matters in the embodiments of the present technology, which are denoted by the identical names, have correspondence. It should be noted that the present technology is not limited to the embodiments and can be embodied by making various modifications to the embodiments without departing from its essence.

It should be noted that the effects described in the specification are merely exemplary and are not limitative and other effects may be provided.

It should be noted that the present technology may also take the following configurations.

(1) A solid-state image pickup element, including:
a photodiode configured to convert incident light into a photocurrent;
an amplification transistor configured to amplify a voltage between a gate having a potential depending on the photocurrent and a source having a predetermined reference potential and output the amplified voltage from a drain; and
a potential supply section configured to supply an anode of the photodiode and a back-gate of the amplification transistor with a predetermined potential lower than the reference potential.

(2) The solid-state image pickup element according to (1), further including
a conversion transistor configured to convert the photocurrent into a voltage between a gate and a source, in which
the conversion transistor includes a source which is connected to a cathode of the photodiode and the gate of the amplification transistor, and
the drain of the amplification transistor is connected to the gate of the conversion transistor.

(3) The solid-state image pickup element according to (2), in which
the photodiode and the amplification transistor are arranged in each of an effective pixel in which light is not shielded and a light-shielding pixel in which light is shielded, and
the potential supply section supplies the anode of the photodiode corresponding to the effective pixel with the predetermined potential and supplies the anode of the photodiode corresponding to the light-shielding pixel with the reference potential.

(4) The solid-state image pickup element according to (2) or (3), in which
the photodiode, the conversion transistor, and the amplification transistor are arranged in a predetermined light-receiving board, and
the potential supply section supplies the light-receiving board with the predetermined potential.

(5) The solid-state image pickup element according to (4), further including
a buffer configured to output a voltage signal output from the amplification transistor;
a subtractor configured to lower a level of the voltage signal from the buffer; and
a comparator configured to compare the lowered voltage signal with a predetermined threshold.

(6) The solid-state image pickup element according to (5), in which
the conversion transistor and the amplification transistor are arranged in a current-to-voltage conversion circuit configured to convert the photocurrent into the voltage signal, and
the current-to-voltage conversion circuit has a power supply voltage different from a power supply voltage of the buffer, the subtractor, and the comparator.

(7) The solid-state image pickup element according to (5) or (6), in which
the buffer, the subtractor, and the comparator include at least a part which is arranged in a predetermined circuit board stacked on the light-receiving board.

(8) An image pickup apparatus, including:
a photodiode configured to convert incident light into a photocurrent;
an amplification transistor configured to amplify a voltage between a gate having a potential depending on the photocurrent and a source having a predetermined reference potential and output the amplified voltage from a drain;
a potential supply section configured to supply an anode of the photodiode and a back-gate of the amplification transistor with a predetermined potential lower than the reference potential; and
a signal processing circuit configured to process a signal output from the amplification transistor.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

100 Image pickup apparatus
110 Image pickup lens
120 Storage unit
130 Control unit
200 Solid-state image pickup element
201 Light-receiving board
202 Circuit board
211, 212, 213, 231, 232, 233 Via-hole arrangement section
220 Light-receiving section
221 Light-receiving circuit
230 Negative-potential supply section
240 Signal processing circuit
251 Row driving circuit
252 Column driving circuit
260 Address event detection section
261 Address event detection circuit
300 Pixel array section
310 Effective pixel
311 Photodiode
315 Light-shielding pixel
320 Current-to-voltage conversion circuit
321, 322, 345, 352, 354 N-type transistor
323, 331, 332, 342, 344, 351, 353 P-type transistor
330 Buffer
340 Subtractor
341, 343 Capacitor
350 Quantizer
360 Transfer circuit
12031 Imaging section

The invention claimed is:
1. A solid-state image pickup element, comprising:
a first substrate;
a second substrate laminated in a stacked arrangement with the first substrate;
a photodiode arranged in the first substrate and configured to convert incident light into a photocurrent;
an amplification transistor arranged in the first substrate and including a gate, a source and a drain, the source is connected to a predetermined reference potential, the amplification transistor is configured to amplify a voltage between the gate being connected to a potential depending on the photocurrent and the source being connected to the predetermined reference potential, and is configured to output the amplified voltage to the drain;
a potential supply section configured to supply an anode of the photodiode and a back-gate of the amplification transistor with a same predetermined potential lower than the predetermined reference potential;

a buffer circuit connected to the amplification transistor and arranged in the second substrate; and a quantizer arranged in the second substrate.

2. The solid-state image pickup element according to claim 1, further comprising a conversion transistor configured to convert the photocurrent into a voltage between a gate and a source, wherein the conversion transistor includes a source which is connected to a cathode of the photodiode and the gate of the amplification transistor, and the drain of the amplification transistor is directly electrically connected to the gate of the conversion transistor.

3. The solid-state image pickup element according to claim 2, wherein the photodiode and the amplification transistor are arranged in each of an effective pixel in which light is not shielded and a light-shielding pixel in which light is shielded, and the potential supply section supplies the anode of the photodiode corresponding to the effective pixel with the same predetermined potential and supplies the anode of the photodiode corresponding to the light-shielding pixel with the predetermined reference potential.

4. The solid-state image pickup element according to claim 2, wherein the conversion transistor is arranged in the first substrate.

5. The solid-state image pickup element according to claim 4, further comprising a subtractor configured to lower a level of the voltage signal from the buffer; and a comparator configured to compare the lowered voltage signal with a predetermined threshold.

6. The solid-state image pickup element according to claim 5, wherein the conversion transistor and the amplification transistor are arranged in a current-to-voltage conversion circuit configured to convert the photocurrent into the voltage signal, and the current-to-voltage conversion circuit has a power supply voltage different from a power supply voltage of the buffer, the subtractor, and the comparator.

7. The solid-state image pickup element according to claim 5, wherein the subtractor and the comparator include at least a part arranged in the second substrate.

8. An image pickup apparatus, comprising:

a first substrate;

a second substrate laminated in a stacked arrangement with the first substrate;

a photodiode arranged in the first substrate and configured to convert incident light into a photocurrent;

an amplification transistor arranged in the first substrate and including a gate, a source and a drain, the source is connected to a predetermined reference potential, the amplification transistor is configured to amplify a voltage between the gate being connected to a potential depending on the photocurrent and the source being connected to the predetermined reference potential, and is configured to output the amplified voltage to the drain;

a potential supply section configured to supply an anode of the photodiode and a back-gate of the amplification transistor with a same predetermined potential lower than the predetermined reference potential;

a buffer circuit connected to the amplification transistor and arranged in the second substrate; and a quantizer arranged in the second substrate; and a signal processing circuit configured to process a signal output from the amplification transistor.

9. The image pickup apparatus according to claim 8, further comprising a conversion transistor configured to convert the photocurrent into a voltage between a gate and a source, wherein the conversion transistor includes a source which is connected to a cathode of the photodiode and the gate of the amplification transistor, and the drain of the amplification transistor is directly electrically connected to the gate of the conversion transistor.

10. The image pickup apparatus according to claim 9, wherein the photodiode and the amplification transistor are arranged in each of an effective pixel in which light is not shielded and a light-shielding pixel in which light is shielded, and the potential supply section supplies the anode of the photodiode corresponding to the effective pixel with the same predetermined potential and supplies the anode of the photodiode corresponding to the light-shielding pixel with the predetermined reference potential.

11. The image pickup apparatus according to claim 9, wherein the conversion transistor is arranged in the first substrate.

12. The image pickup apparatus according to claim 11, further comprising a subtractor configured to lower a level of the voltage signal from the buffer; and a comparator configured to compare the lowered voltage signal with a predetermined threshold.

13. The image pickup apparatus according to claim 12, wherein the conversion transistor and the amplification transistor are arranged in a current-to-voltage conversion circuit configured to convert the photocurrent into the voltage signal, and the current-to-voltage conversion circuit has a power supply voltage different from a power supply voltage of the buffer, the subtractor, and the comparator.

14. The image pickup apparatus according to claim 12, wherein the subtractor and the comparator include at least a part arranged in the second substrate.

15. The solid-state image pickup element according to claim 1, wherein the source of the amplification transistor is directly electrically connected to the predetermined reference potential.

16. The image pickup apparatus according to claim 8, wherein the source of the amplification transistor is directly electrically connected to the predetermined reference potential.

* * * * *